United States Patent [19]

Suh et al.

[11] Patent Number: 5,693,542

[45] Date of Patent: Dec. 2, 1997

[54] METHOD FOR FORMING A TRANSISTOR WITH A TRENCH

[75] Inventors: Jeung Won Suh; Kwang Myoung Rho; Seong Min Hwang, all of Bubaleub, Rep. of Korea

[73] Assignee: Hyundai Electronics Industries Co., Ltd., Rep. of Korea

[21] Appl. No.: 554,891

[22] Filed: Nov. 9, 1995

[30] Foreign Application Priority Data

Dec. 26, 1994 [KR] Rep. of Korea .................. 1994-36937

[51] Int. Cl.⁶ .................................................. H01L 21/786
[52] U.S. Cl. .................. 437/21; 437/67; 437/72; 437/203
[58] Field of Search ................................. 437/21, 44, 45, 437/67, 68, 72, 203; 148/DIG. 50

[56] References Cited

U.S. PATENT DOCUMENTS 4,636,281  1/1987  Buiguez ........................ 437/67
5,362,669 11/1994  Boyd et al. .................... 437/67
5,399,520  3/1995  Jang ............................. 437/72
5,494,837  2/1996  Subramanian et al. ........ 437/62

FOREIGN PATENT DOCUMENTS 3-198339  8/1991  Japan ........................... 437/72

*Primary Examiner*—Chandra Chaudhari
*Attorney, Agent, or Firm*—Blakely Sokoloff Taylor & Zafman

[57] ABSTRACT

A method for forming a transistor comprising the steps of: forming a trench in a substrate; filling an insulating layer in the lower portion of said trench except for the upper portion thereof; filling a conductive layer in the upper portion of said trench and on said insulating layer for a channel of the said transistor; forming a gate oxide layer on the resulting structure; and forming a gate electrode on said gate oxide layer; and implanting impurity ions into said substrate to form a source/drain region.

20 Claims, 14 Drawing Sheets

METHOD FOR FORMING A TRANSISTOR WITH A TRENCH

BACKGROUND OF THE INVENTION

The present invention relates to a transistor having an improved electric feature and a method for forming the same.

In general, a transistor structure includes the steps of forming an oxide layer on a substrate and forming a transistor on a silicon substrate layer is formed under. This transistor structure improves the characteristics of the device in that the capacitance in the source/drain junction layers is minimized.

On the other hand, since the short channel effect and the hot carrier effect are increased, according to the scaled-down transistors in size thereof, the transistors are designed in order to improve these effects by the theory of the transistor scaling and the LDD(Lightly Doped Drain) structure.

Although, in deep submicron transistors, these betterments of transistors have been developed, operating features of these transistors are deteriorated by the short channel effects such as punchthrough.

SUMMARY OF THE INVENTION

An object of the present invention is to provide a transistor and a method for forming the same capable of preventing the short channel effects (particularly, punchthrough of PMOS transistors) from being generated and improving the operating feature thereof.

In accordance with the present invention, a method for forming a transistor comprises the steps of: forming a trench in a substrate; filling an insulating layer in the lower portion of said trench except for the upper portion thereof; filling a conductive layer in the upper portion of said trench and on said insulating layer for a channel of the said transistor; forming a gate oxide layer on the resulting structure; forming a gate electrode on said gate oxide layer; and implanting impurity ions into said substrate to form a source/drain region.

In accordance with the present invention, a method for forming a transistor comprises the steps of: forming a lightly doped layer on a substrate; forming a first insulating layer on said lightly doped layer and patterning said first insulating layer; forming a trench in a substrate by etching said lightly doped layer and said substrate, using said patterned first insulating layer as an etching mask; filling a second insulating layer in the lower portion of said trench except for the upper portion thereof, wherein a selective etching rate of said second insulating layer is much lower than that of said first insulating layer; filling a conductive layer in the upper portion of said trench and on said second insulating layer for a channel of the said transistor; removing said first insulating layer; forming a gate oxide layer on the resulting structure; forming a gate electrode on said gate oxide layer; and implanting impurity ions into said substrate to form a source/drain region.

In accordance with the present invention, a method for forming a transistor comprises the steps of: forming a first and second insulating layer, in turn, on a substrate; patterning said first and second insulating layer to expose said substrate; forming a trench in said substrate, using said patterned second insulating layer as an etching mask; filling an oxide layer in said trench by oxidizing said exposed substrate; removing said second insulating layer; etching back said oxide layer, leaving the residual thereof in the lower portion of said trench; filling a conductive layer in the upper portion of said trench and on said oxide layer for a channel of the said transistor; removing said first insulating layer; forming a gate oxide layer on the resulting structure; forming a gate electrode on said gate oxide layer; and implanting impurity ions into said substrate to form a source/drain region.

In accordance with the present invention, a transistor having a gate insulating on a substrate, a gate electrode, and a source/drain region comprises: a trench formed in said substrate between said source region and said drain region; an insulating layer filled in the lower portion of said trench; and a silicon layer layer filled up the upper portion of said trench and on said insulating layer for forming a channel of the said transistor; whereby said insulating layer is formed under said transistor's channel to improve a punchthrough feature thereof.

BRIEF DESCRIPTION OF THE DRAWINGS

The present invention may be better understood and its numerous objects and advantages will become apparent to those skilled in the art by reference to the accompanying drawings as follow.

DETAILED DESCRIPTION OF THE INVENTION

Hereinafter, the present invention will be described referring to the accompanying drawings.

First, an embodiment of the present invention will be described referring to FIGS. 1A through 1J.

Figure 1A:
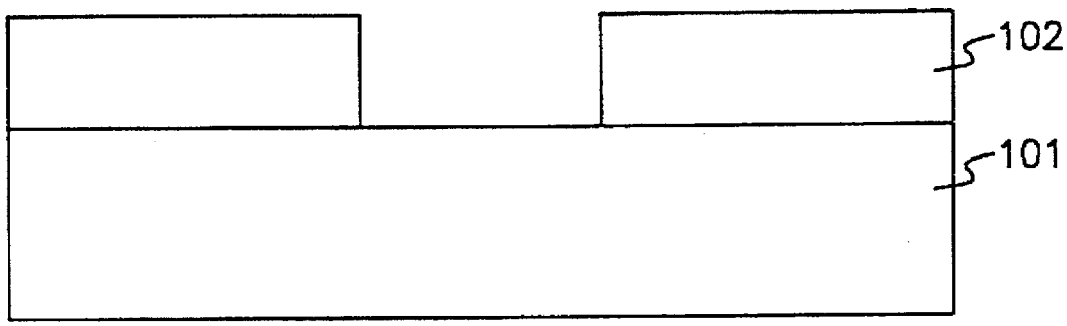
FIGS. 1A through 1J are cross-sectional views illustrating a method for forming a transistor in accordance with an embodiment of the present invention.

As shown in FIG. 1A, an oxide layer 102 is deposited on a silicon substrate 101, and a portion of the oxide layer 102 is etched by a mask process. An etching process to form a trench in the silicon substrate 101 is performed.

Figure 1B:
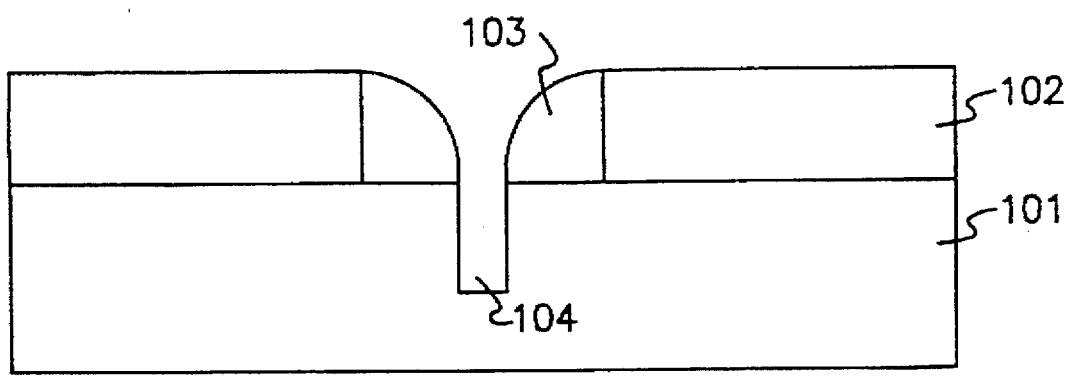

As shown in FIG. 1B, an oxide spacer layers 103 are formed on the sidewall of the oxide layer 102 to form the trench which has a narrower width than that of the patterned oxide layer by the mask process in FIG. 1A, and a trench 104 is formed by etching the exposed silicon substrate 101, using the oxide layer 102 and the oxide spacer layers 103 as an etching mask. Of course, since oxide spacer layers 103 are used for decreasing the width of the trench 104, the step of forming the oxide spacer layers 103 can be skipped according to manufacturing conditions.

Figure 1C:
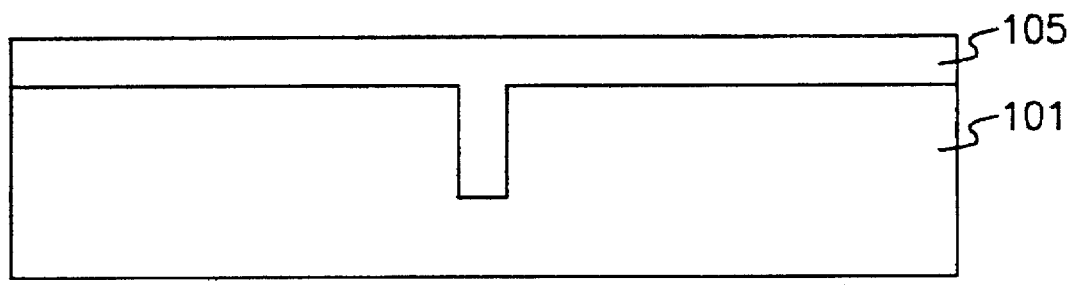

As shown in FIG. 1C, the residual oxide layers 102 and 103 on the silicon substrate 101 are removed, and an oxide layer 105 is formed on the resulting structure, thereby filling in the trench 104.

Figure 1D:
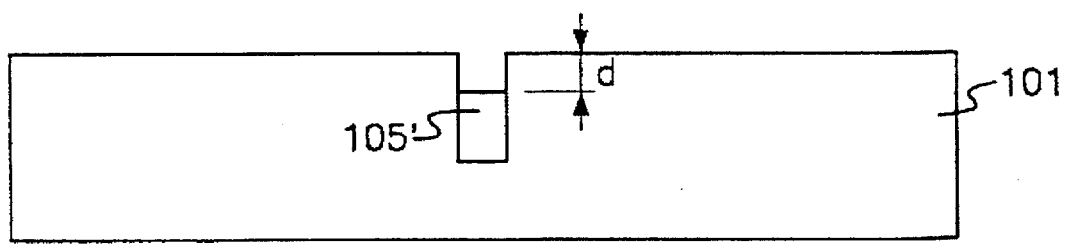

Next, as shown in FIG. 1D, the oxide layer 105 is etched back except for the oxide layer 105' in the trench 104. Also, the etching rate is controled in order that the depth "d" is formed from the surface of the silicon substrate 101 to the surface of the oxide layer 105' in the trench 104. The depth "d" is needed for forming a channel of the MOS transistor which will be described by following process.

Figure 1E:
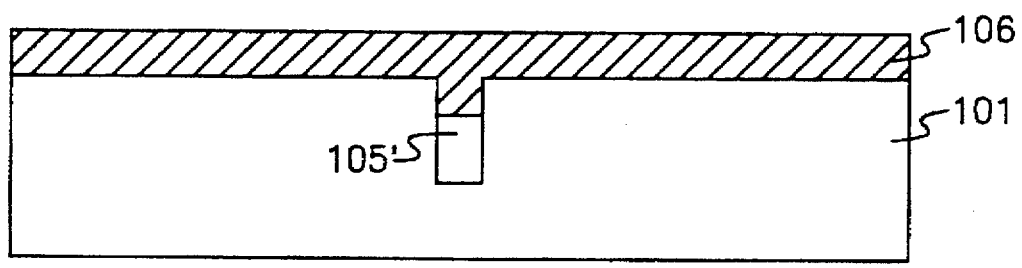

Referring now to FIG. 1E, a polysilicon layer 106 is formed on the resulting structure, filling in the trench 104 which is not still filled with the oxide layer 105'. The polysilicon layer 106 can be substituted for a silicon layer.

Figure 1F:
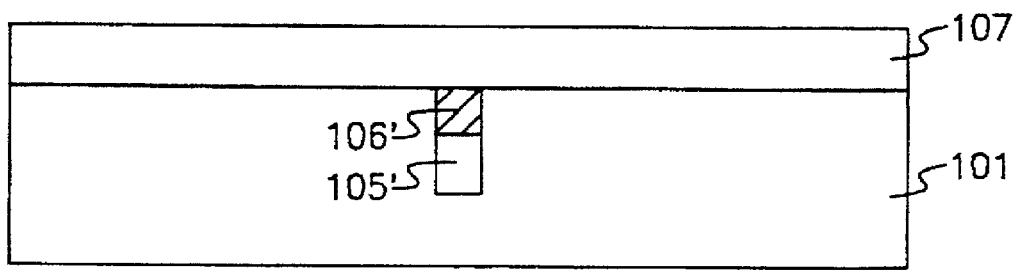

As shown in FIG. 1F, the polysilicon layer 106 over the surface of the silicon substrate 101 is oxidized by an oxidation process which is used in the conventional semiconductor process. Then, an oxide layer 107 is formed by the the oxidation process and a polysilicon layer 106' remains from the surface of the silicon substrate 101 to the surface of the oxide layer 105' in the trench 104. At this time, the polysilicon layer 106' serves as a substrate.

Figure 1G:
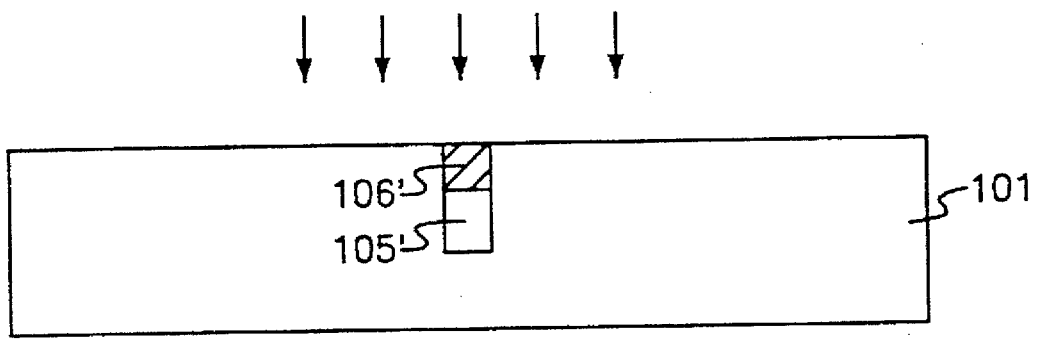

The oxide layer 107 is removed and an ion implantation is performed to adjust the threshold voltage of the transistor, as shown in FIG. 1G.

Figure 1H:
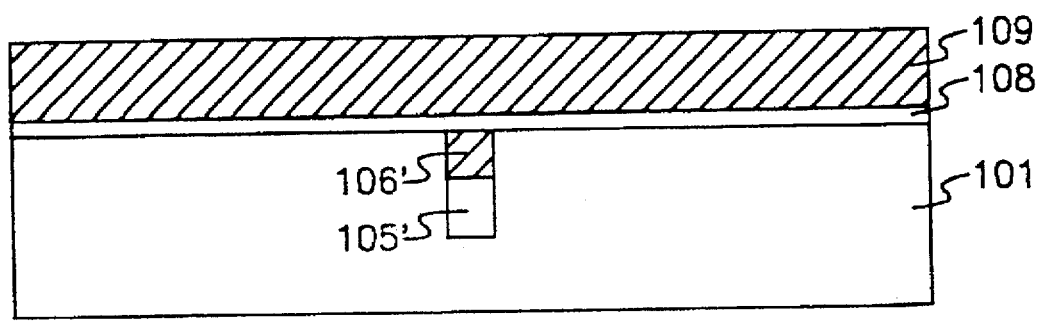

FIG. 1H illustrates the step of forming, in turn, an oxide layer 108 and a polysilicon layer 109 for the gate electrode.

Figure 1I:
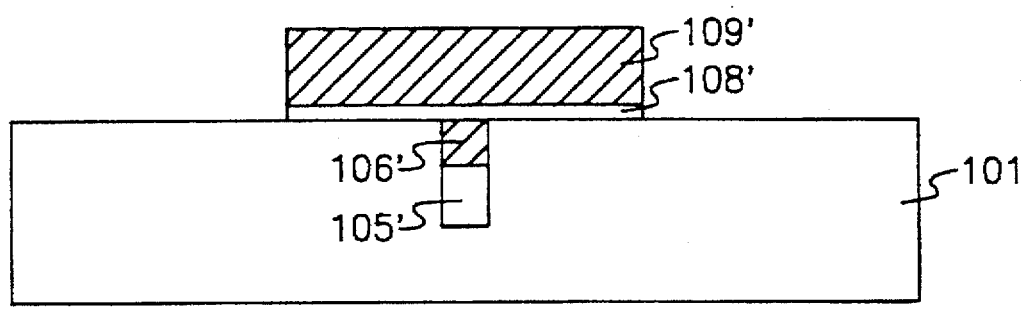

FIG. 1I illustrates the step of patterning the oxide layer 108 and the polysilicon layer 109 in a predetermined size, and then, forming a gate oxide layer 108' and a gate electrode 109'.

Figure 1J:
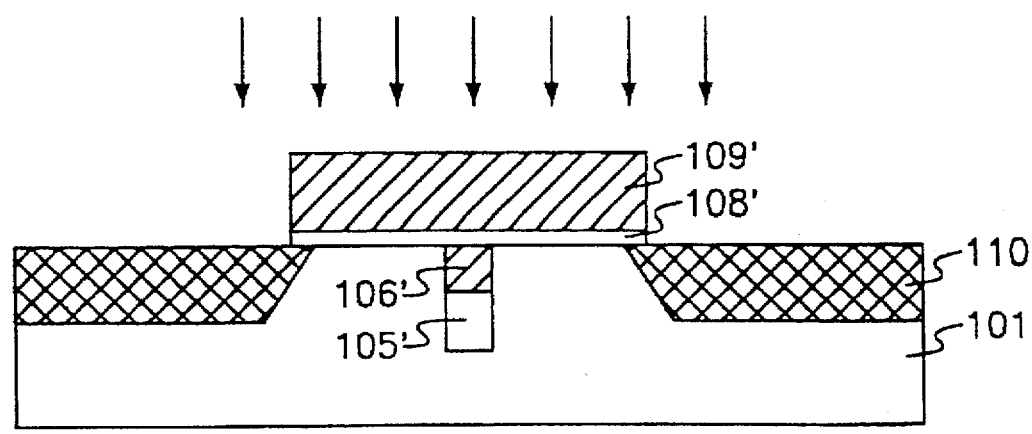

Finally, as shown in FIG. 1J, a source/drain region 110 is formed by an ion implantation.

As illustrated above, the transistor, in accordance with an embodiment of the present invention, differs from the conventional transistor in the formation of the oxide layer 105' and the polysilicon layer 106' in the silicon substrate 101, in order to improve the feature of the punchthrough of the transistor.

Now, another embodiment of the present invention will be described referring to FIGS. 2A through 2I.

Figure 2A:
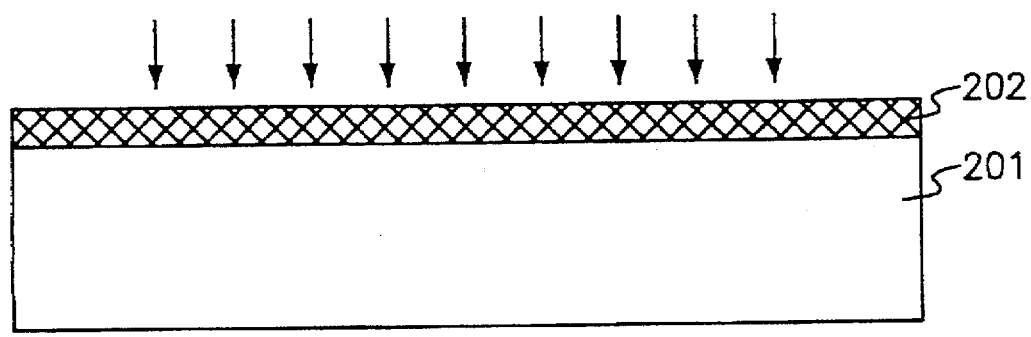
FIGS. 2A through 2I are cross-sectional views illustrating a method for forming a transistor in accordance with another embodiment of the present invention.

As shown in FIG. 2A, low concentration ions (n- or p-), whose impurity type is different from that of a substrate 201, are implanted into a silicon substrate 201, and then a doped region 202 is formed on the silicon substrate 201.

Figure 2B:
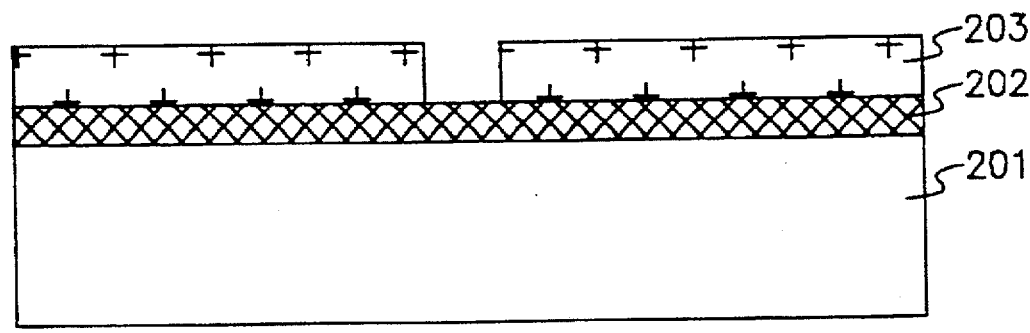

As shown in FIG. 2B, a nitride layer 203 is formed on the doped region 202, and the nitride layer 203 is patterned in order to expose a portion of the silicon substrate 201 using a mask process and an etching process.

Figure 2C:
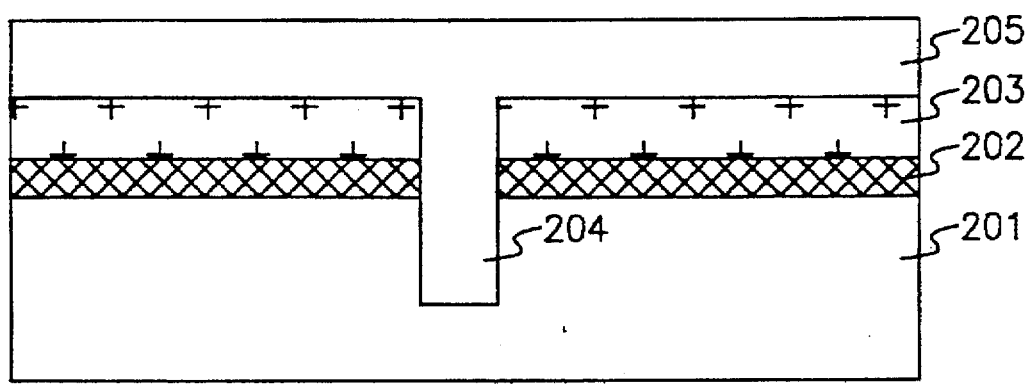

As shown in FIG. 2C, a trench 204 is formed by etching the doped region 202 and the exposed silicon substrate 201, using the nitride layer 203 as an etching mask. Of course, oxide spacer layers as illustrated in FIG. 1B can be used for decreasing the width of the trench 204. After forming the trench 204, an oxide layer 205 is formed on the resulting structure, thereby filling in the trench 204.

Figure 2D:
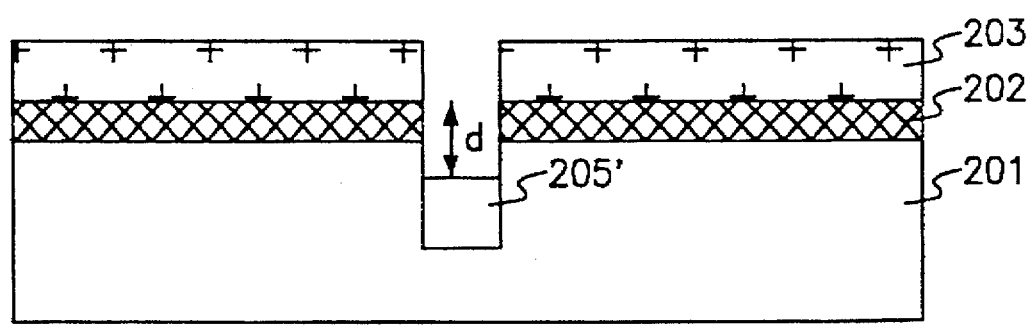

Next, as shown in FIG. 2D, the oxide layer 205 is etched back except for the oxide layer 205' in the trench 204. Also, the etching rate must be controled in order that the depth "d" is formed from the surface of the silicon substrate 201 to the surface of the oxide layer 205' in the trench 204. The depth "d" is needed for forming a channel of the MOS transistor which will be described by the following process.

Figure 2E:
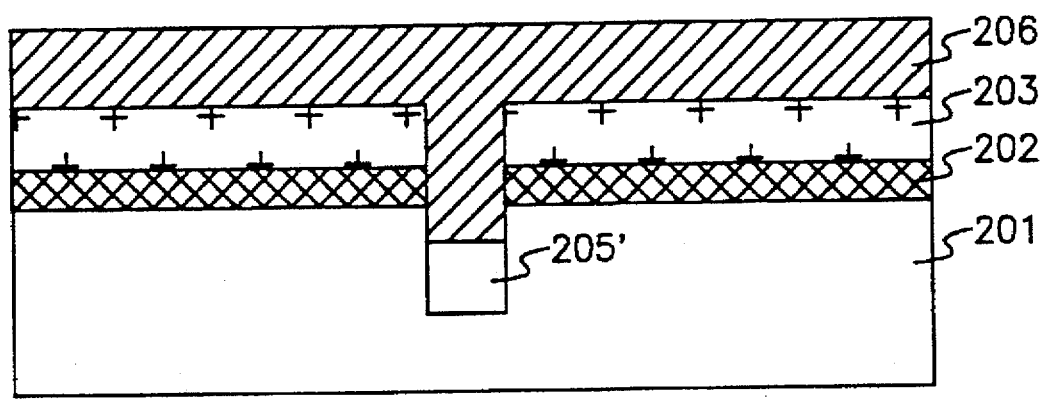

Referring now to FIG. 2E, a polysilicon layer 206 is formed on the resulting structure, filling in the trench 204 which is not still filled with the oxide layer 205'.

Figure 2F:
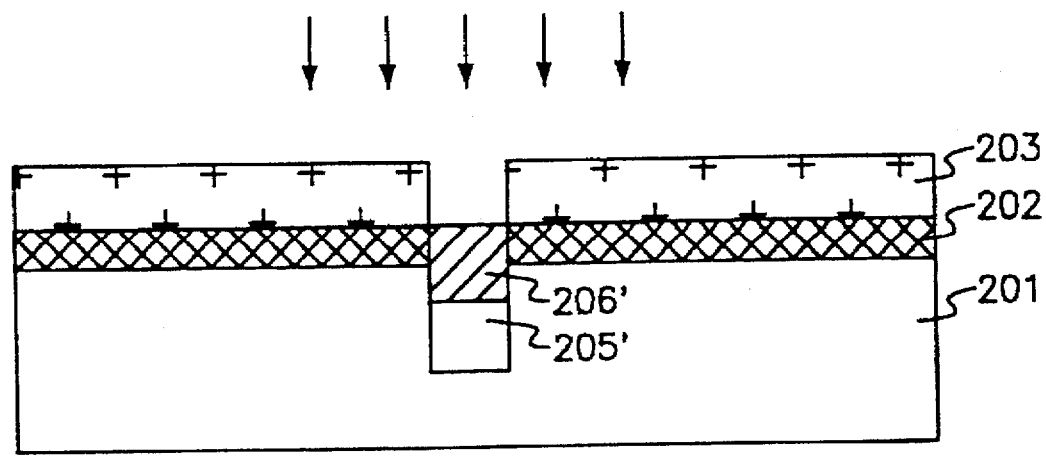

As shown in FIG. 2F, the polysilicon layer 206 is etched back such that a polysilicon layer 206', which serves as a substrate, is formed only in the trench 204, and an ion implantation is performed to adjust the threshold voltage of the transistor.

Figure 2G:
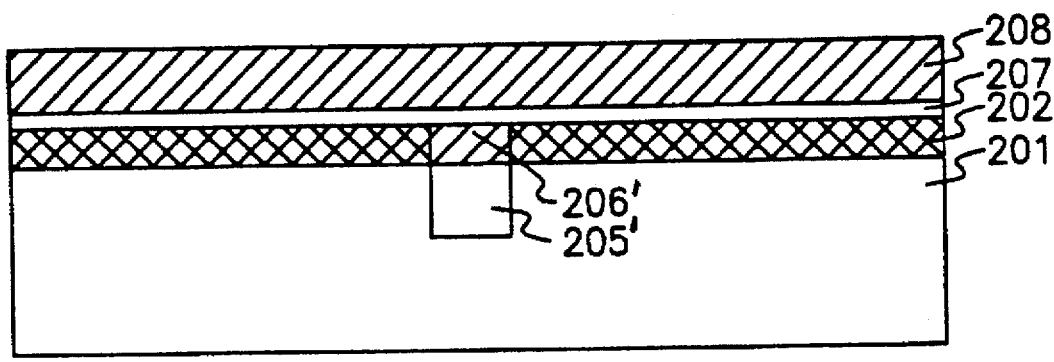
Figure 2H:
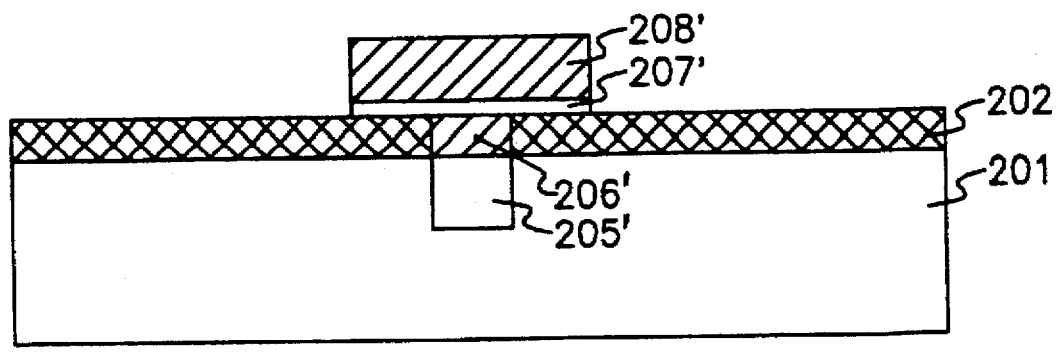

FIG. 2G illustrates the step of forming, in turn, an oxide layer 207 and a polysilicon layer 208 for the gate electrode, and FIG. 2H illustrates the step of patterning the gate oxide layer 207' and a gate electrode 208' in a predetermined size.

Figure 2I:
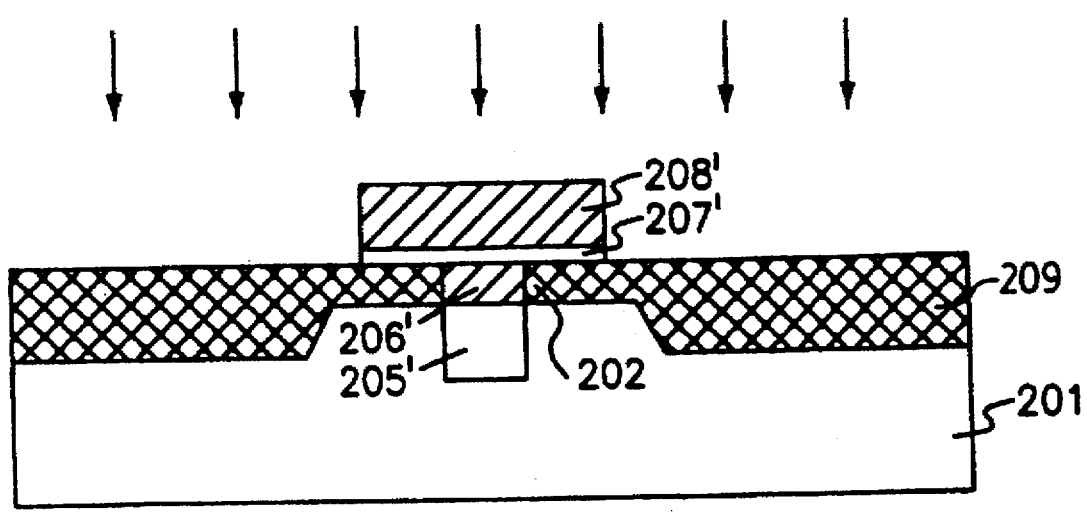

Finally, as shown in FIG. 2I, a source/drain region 209, which is highly doped region, is formed by an ion implantation.

As illustrated above, this embodiment shows that transistors having the LDD structure in FIG. 1J are accomplished with the doped region 202.

Furthermore, another embodiment of the present invention will be described referring to FIGS. 3A through 3H.

Figure 3A:
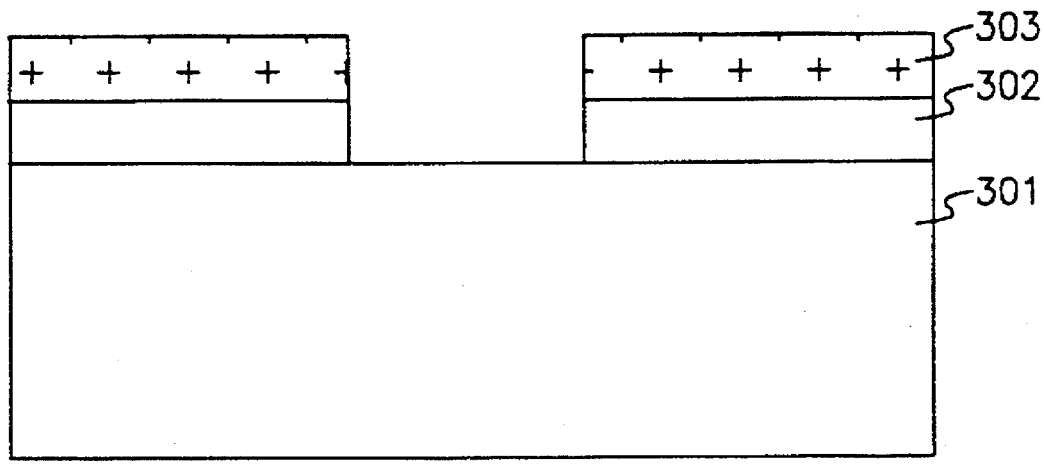
FIGS. 3A through 3H are cross-sectional views illustrating a method for forming a transistor in accordance with further another embodiment of the present invention.

As shown in FIG. 3A, an oxide layer 302 and a nitride layer 303 is, in turn, deposited on a silicon substrate 301, and a portion of the oxide layer 302 and the nitride layer 303 are etched by a mask process and an etching process in order to form a trench in the silicon substrate 301.

Figure 3B:
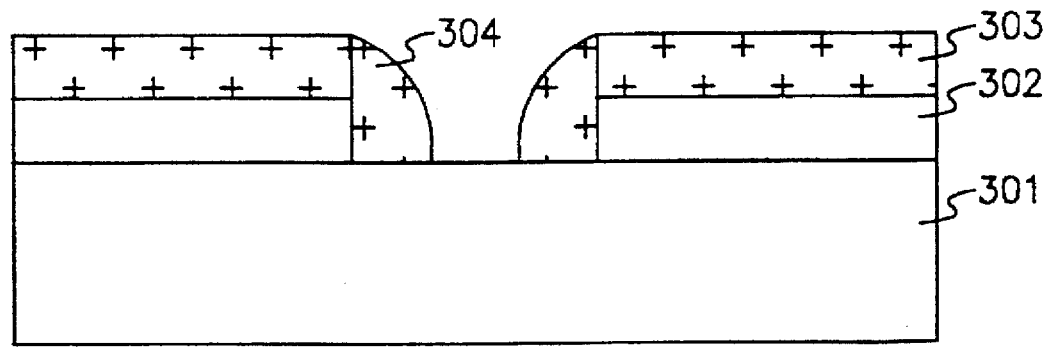

As shown in FIG. 3B, a nitride spacer layer 304 are formed on the sidewall of the oxide layer 302 and the nitride layer 303 to form the trench, which has a narrower width than that of the patterned oxide and nitride layer, by the mask process in FIG. 3A.

Figure 3C:
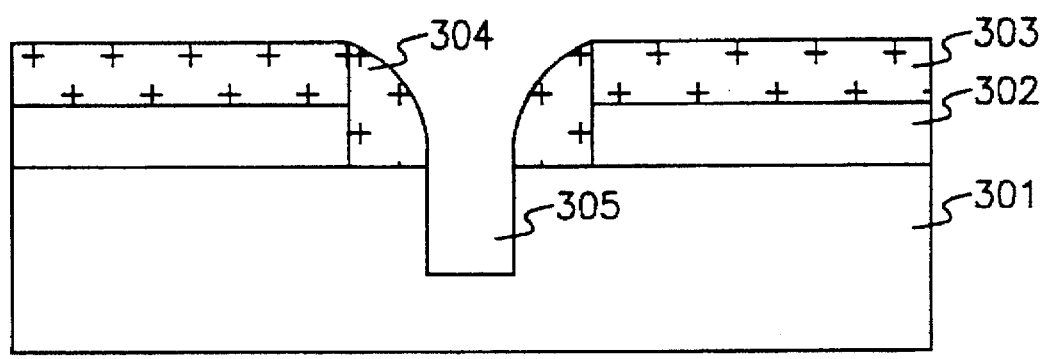

As shown in FIG. 3C, a trench 305 is formed by etching the exposed silicon substrate, using the nitride layer 303 and the nitride spacer layers 304 as an etching mask. Of course, since the nitride spacer layer 304 is used for decreasing the width of the trench 305, the step of forming the nitride spacer layers 304 can be skipped according to manufacturing conditions as illustrated in FIG. 1B.

Figure 3D:
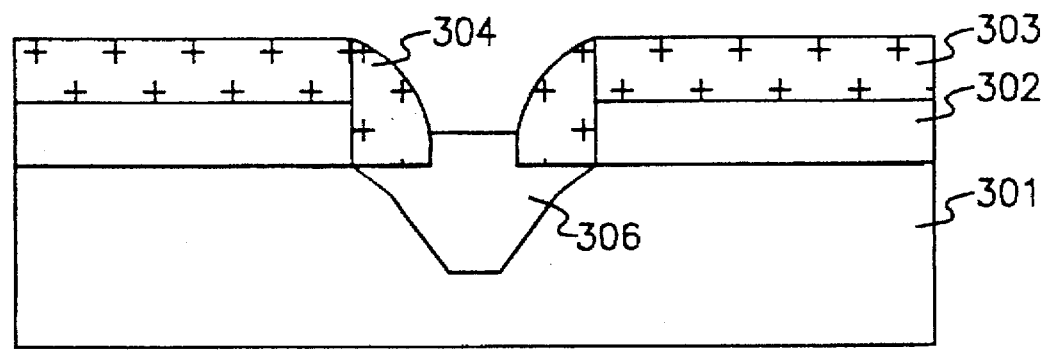

Next, as shown in FIG. 3D, the exposed substrate 301 is oxidized using the nitride layer 303 and the nitride spacer layer 304 as an oxidation mask so that an oxide layer 306 is formed in the trench 305.

Figure 3E:
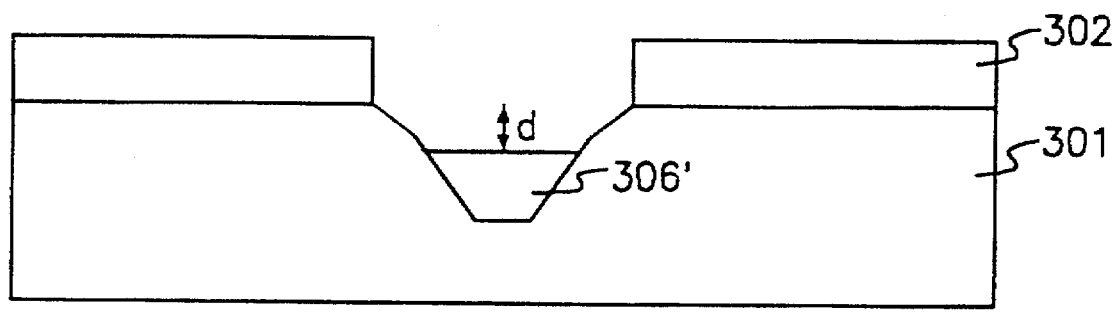

After the nitride layer 303 and the nitride spacer layer 304 are removed, the oxide layer 306 is etched back except for the oxide layer 306' in the trench 305, as shown in FIG. 3E. At this time, the etching rate is controled in order that the depth "d" is formed from the surface of the silicon substrate 301 to the surface of the oxide layer 306' in the trench 305. The depth "d" is needed for forming a channel of the MOS transistor which will be described by the following process.

Figure 3F:
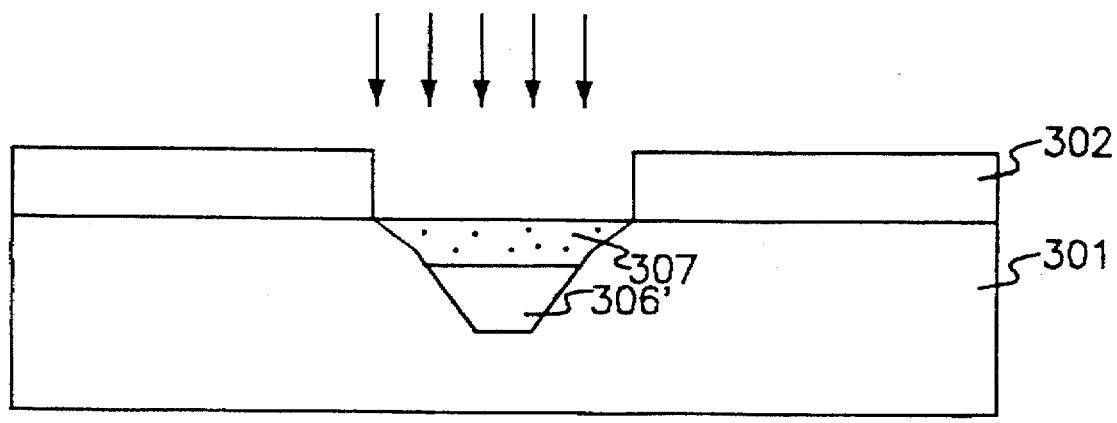
Figure 3G:
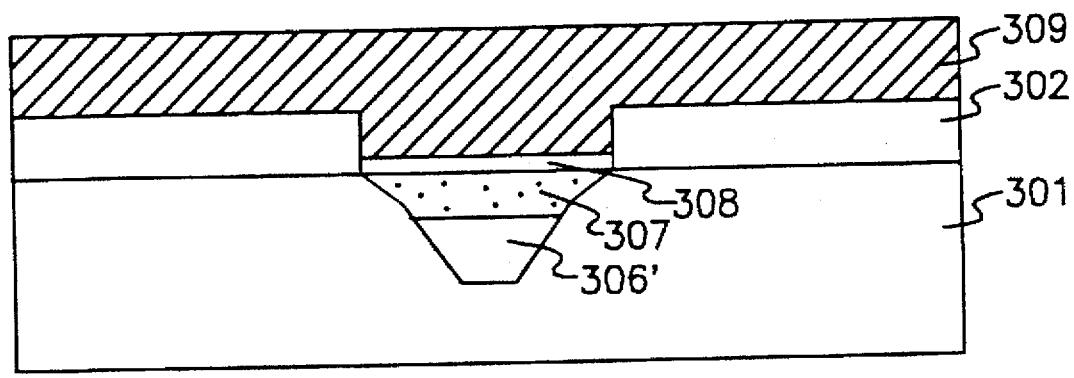

Referring now to FIG. 3F, an epitaxy process is applied to the exposed silicon substrate 301 such that a silicon layer 307 is filled in the trench 305 which is not still filled with the oxide layer 306'. After forming the silicon layer 307, impurity ions to control the threshold voltage is implanted into the silicon layer 307 using the oxide layer 302 as an ion implanting mask As shown in FIG. 3G, a gate oxide layer 308 is formed on the polysilicon layer 307 grown by epitaxy process and a polysilicon layer 309 for the gate electrode is formed on the resulting structure.

Figure 3H:
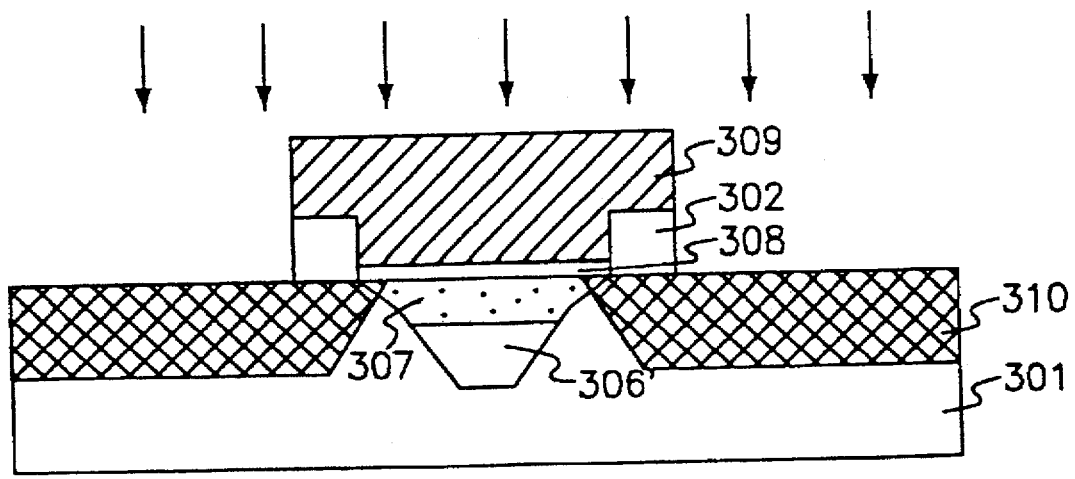

Referring to FIG. 3H, a polysilicon layer 309' and an oxide layer 302' is patterned in a predetermined size, and a source/drain region 310 is formed by an ion implantation.

As stated above, the present invention can effectively improve punchthrough feature PMOS transistors having a short channel and forming an insulating layer under the channel, therefore, having an effect on stability of transistors' operation.

In compliance with statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for forming a transistor comprising the steps of:

forming a trench in a substrate, wherein a width of said trench is narrower than that of a channel to be formed;

filling an insulating layer in the lower portion of said trench except for the upper portion thereof;

filling a conductive layer in the upper portion of said trench and on said insulating layer, wherein said conductive layer serves as a part of said channel of said transistor;

forming a gate oxide layer on the resulting structure;

forming a gate electrode on said gate oxide layer; and implanting impurity ions into said substrate to form a source/drain region.

2. A method in accordance with claim 1, wherein the step of filling a conductive layer in the upper portion of said trench and on said insulating layer further comprises the step of implanting impurity ions into said conductive layer to adjust the threshold voltage.

3. A method in accordance with claim 1, wherein the step of forming said trench comprises the steps of:

forming a first oxide layer on said substrate;

patterning said first oxide layer;

forming a second oxide layer on the resulting structure;

applying blanket etching process to said second oxide layer so as to form a spacer oxide layer; and etching said substrate using said first oxide layer and said spacer oxide layer as an etching mask.

4. A method in accordance with claim 1, wherein the step of filling said insulating layer in said upper portion of said trench comprises the steps of:

forming an oxide layer on said substrate with said trench; and etching back said oxide layer, leaving the residual thereof in the lower portion of said trench.

5. A method in accordance with claim 1, wherein the step of filling said conductive layer in said upper portion of said trench comprises:

forming a silicon layer on the resulting structure, filling in said upper portion of said trench and on said insulating layer;

oxidizing said silicon layer over said substrate; and removing said oxidized silicon layer.

6. A method in accordance with claim 5, wherein said silicon layer is made of polycrystalline.

7. A method for forming a transistor comprising the steps of:

forming a lightly doped layer on a substrate;

forming a first insulating layer on said lightly doped layer and patterning said first insulating layer;

forming a trench in a substrate by etching said lightly doped layer and said substrate, using said patterned first insulating layer as an etching mask, wherein a width of said trench is narrower than that of a channel to be formed;

filling a second insulating layer in the lower portion of said trench except for the upper portion thereof, wherein said conductive layer serves as a part of said channel of said transistor;

filling a conductive layer in the upper portion of said trench and on said second insulating layer for said channel of said transistor;

removing said first insulating layer;

forming a gate oxide layer on the resulting structure;

forming a gate electrode on said gate oxide layer; and implanting impurity ions into said substrate to form a source/drain region.

8. A method in accordance with claim 7, wherein the step of filling said conductive layer in the upper portion of said trench and on said second insulating layer further comprises the step of implanting impurity ions into said conductive layer to adjust the threshold voltage.

9. A method in accordance with claim 7, wherein said first insulating layer is a nitride layer.

10. A method in accordance with claim 7, wherein said second insulating layer is an oxide layer.

11. A method in accordance with claim 7, wherein the step of forming said trench in said substrate further comprises the step of forming a spacer nitride layer on the sidewall of said patterned first insulating layer.

12. A method in accordance with claim 7, wherein the step of filling said insulating layer in said lower portion of said trench comprises the steps of:

forming an oxide layer on the resulting structure; and etching back said first oxide layer, leaving the residual thereof in the lower portion of said trench.

13. A method in accordance with claim 7, wherein the step of filling said conductive layer in said upper portion of said trench comprises the steps of:

forming a silicon layer on the resulting structure, filling in said upper portion of said trench;

oxidizing said silicon layer over said substrate; and removing said oxidized silicon layer.

14. A method in accordance with claim 13, wherein said silicon layer is made of polycrystalline.

15. A method for forming a transistor comprising the steps of:

forming first and second insulating layers, in turn, on a substrate;

patterning said first and second insulating layers to expose a portion of said substrate;

forming a trench in said substrate, using said patterned second insulating layer as an etching mask; filling an oxide layer in said trench by oxidizing said exposed substrate;

removing said second insulating layer;

etching back said oxide layer, leaving the residual thereof in the lower portion of said trench;

filling a first conductive layer in the upper portion of said trench and on said oxide layer for a channel of said transistor;

forming a gate oxide layer on said first conductive layer;

forming a second conductive layer for a gate electrode on the resulting structure;

patterning said second conductive layer and said first insulating layer; and implanting impurity ions into said substrate to form a source/drain region.

16. A method in accordance with claim 15, wherein the step of filling said first conductive layer in the upper portion of said trench and on said insulating layer further comprises the step of implanting impurity ions into said first conductive layer to adjust the threshold voltage.

17. A method in accordance with claim 15, wherein said first conductive layer is an epitaxial layer.

18. A method in accordance with claim 15, wherein said first insulating layer is an oxide layer.

19. A method in accordance with claim 15, wherein said first insulating layer is a nitride layer.

20. A method in accordance with claim 15, wherein the step of patterning said first and second insulating layers to expose said substrate further comprises the step of forming a spacer nitride layer on the sidewall of said first and second insulating layers.

* * * * *

UNITED STATES PATENT AND TRADEMARK OFFICE
CERTIFICATE OF CORRECTION

PATENT NO. : 5,693,542
DATED : December 2, 1997
INVENTOR(S) : Suh et al.

It is certified that error appears in the above-identified patent and that said Letters Patent is hereby corrected as shown below:

In column 1 at line 9, please delete " structure ".

In column 1 at line 11, please delete " substrate " and insert -- substrate which the oxide --.

Column 1, line 12, delete "structure".

Signed and Sealed this

Sixth Day of October, 1998

*Attest:*

BRUCE LEHMAN

*Attesting Officer*   Commissioner of Patents and Trademarks